United States Patent
Lee et al.

(10) Patent No.: US 8,915,419 B2
(45) Date of Patent: Dec. 23, 2014

(54) METHOD FOR SURFACE-TREATING PRINTED CIRCUIT BOARD AND PRINTED CIRCUIT BOARD

(75) Inventors: Su Jin Lee, Busan (KR); Hye In Kim, Busan (KR); Young Kwan Lee, Busan (KR); Chang Kyung Woo, Busan (KR); Je Kyoung Kim, Busan (KR)

(73) Assignee: Samsung Electro-Mechanics Co., Ltd., Suwon Gyunggi-Do (KR)

( * ) Notice: Subject to any disclaimer, the term of this patent is extended or adjusted under 35 U.S.C. 154(b) by 173 days.

(21) Appl. No.: 13/524,701

(22) Filed: Jun. 15, 2012

(65) Prior Publication Data

US 2013/0025913 A1 Jan. 31, 2013

(30) Foreign Application Priority Data

Jul. 27, 2011 (KR) .................. 10-2011-0074593

(51) Int. Cl.
| | |
|---|---|
| *B23K 31/02* | (2006.01) |
| *B23K 1/20* | (2006.01) |
| *H05K 3/28* | (2006.01) |
| *H05K 3/34* | (2006.01) |
| *H05K 3/26* | (2006.01) |

(52) U.S. Cl.
CPC ............ *H05K 3/282* (2013.01); *H05K 3/3484* (2013.01); *H05K 2203/095* (2013.01); *H05K 3/26* (2013.01)
USPC .................... 228/203; 228/205; 228/248.1

(58) Field of Classification Search
None
See application file for complete search history.

(56) References Cited

U.S. PATENT DOCUMENTS

| | | | | |
|---|---|---|---|---|
| 5,899,737 | A * | 5/1999 | Trabucco ............... | 438/615 |
| 6,796,482 | B2 * | 9/2004 | Wetz et al. ............. | 228/207 |
| 7,171,897 | B2 * | 2/2007 | Barajas et al. ......... | 101/129 |
| 2002/0061642 | A1 * | 5/2002 | Haji et al. .............. | 438/613 |
| 2004/0041241 | A1 | 3/2004 | Vo et al. | |
| 2007/0217167 | A1 * | 9/2007 | Murai et al. ........... | 361/748 |
| 2007/0269973 | A1 * | 11/2007 | Nalla et al. ............ | 438/612 |
| 2007/0298546 | A1 * | 12/2007 | Lee et al. .............. | 438/124 |

(Continued)

FOREIGN PATENT DOCUMENTS

| | | |
|---|---|---|
| EP | 288240 A2 * | 2/2011 |
| JP | 05-063355 A | 3/1993 |

(Continued)

OTHER PUBLICATIONS

Japanese Office Action issued in Japanese Application No. 2012-137547 dated May 7, 2013.

(Continued)

*Primary Examiner* — Kiley Stoner
(74) *Attorney, Agent, or Firm* — McDermott Will & Emery LLP

(57) ABSTRACT

Disclosed herein are a method for surface-treating a printed circuit board and a printed circuit board including a surface treatment layer. The method includes: plasma-treating a surface of a printed circuit board; treating the plasma-treated substrate with an organic solderability preserve; performing heat treatment on the substrate treated with the organic solderability preserve; printing a solder paste on the substrate subjected to the heat treatment; reflowing the solder paste printed substrate to fix the solder paste; and deflux washing the resulting substrate.

According to the present invention, the discoloration problem due to oxidation of copper can be solved by performing heat treatment under predetermined conditions after treatment with an organic solderability preserve. Therefore, the present invention can meet various multi-reflow processes, as compared with products of the related art.

5 Claims, 4 Drawing Sheets

(56) References Cited

U.S. PATENT DOCUMENTS

| | | | |
|---|---|---|---|
| 2008/0085595 A1* | 4/2008 | Li | 438/612 |
| 2008/0145972 A1* | 6/2008 | Ishikawa et al. | 438/120 |
| 2010/0044848 A1* | 2/2010 | Suh et al. | 257/686 |
| 2010/0058585 A1* | 3/2010 | Remizov et al. | 29/846 |
| 2011/0042347 A1* | 2/2011 | Korngold et al. | 216/13 |
| 2011/0186334 A1* | 8/2011 | Humphries et al. | 174/251 |
| 2011/0201194 A1* | 8/2011 | Gruber et al. | 438/613 |
| 2011/0253429 A1* | 10/2011 | Humphries et al. | 174/255 |
| 2011/0263121 A1* | 10/2011 | Usui et al. | 438/669 |
| 2013/0008938 A1* | 1/2013 | Kim et al. | 228/203 |
| 2013/0112469 A1* | 5/2013 | Watanabe et al. | 174/263 |
| 2013/0113099 A1* | 5/2013 | Lim et al. | 257/738 |
| 2013/0168132 A1* | 7/2013 | Lee et al. | 174/250 |
| 2013/0277827 A9* | 10/2013 | Pendse | 257/737 |

FOREIGN PATENT DOCUMENTS

| | | |
|---|---|---|
| JP | 05-175643 A | 7/1993 |
| JP | 05-186880 A | 7/1993 |
| JP | 2000-022317 A | 1/2000 |
| JP | 2000-357853 A | 12/2000 |
| JP | 2002-118351 A | 4/2002 |
| JP | 2007-173672 A | 7/2007 |
| KR | 10-2007-0062086 A | 6/2007 |
| KR | 10-2009-0112938 A | 10/2009 |
| WO | WO 2005/072111 A2 * | 8/2005 |

OTHER PUBLICATIONS

Korean Notice of Allowance issued in Korean Application No. 10-2011-0074593 dated Jul. 18, 2012.

* cited by examiner

- PRIOR ART -

- PRIOR ART -

- PRIOR ART -

- PRIOR ART -

- PRIOR ART -

METHOD FOR SURFACE-TREATING PRINTED CIRCUIT BOARD AND PRINTED CIRCUIT BOARD

CROSS REFERENCE(S) TO RELATED APPLICATIONS

This application claims the benefit under 35 U.S.C. Section 119 of Korean Patent Application Serial No. 10-2011-0074593, entitled "Method for Surface-Treating Printed Circuit Board and Printed Circuit Board" filed on Jul. 27, 2011, which is hereby incorporated by reference in its entirety into this application.

BACKGROUND OF THE INVENTION

1. Technical Field

The present invention relates to a method for surface-treating a printed circuit board and a printed circuit board including a surface treatment layer manufactured by the method.

2. Description of the Related Art

Recently, an immersion tin plating method and the use of silver and organic solderability preservative (OSP) are required in a printed circuit board (PCB) field, due to an increase in cost of raw material for gold plating in surface treatment. Among them, a method using the organic solderability preservative is increasingly used since it has advantages in view of unit cost as well as management.

FIG. 1 is a view schematically showing a procedure of surface-treating a printed circuit board according to the related art. First, a substrate treated with plasma is surface-treated by using a method using an organic solderability preserve. A solder paste is printed on the surface-treated substrate, followed by a reflow curing process and a deflux washing process.

Among surface treatment methods, the method using an organic solderability preserve, in spite of the above advantages, has problems in that thermal damage occurs after a reflow process and an organic solderability preserve film is removed after the deflux washing process, since components of the organic solderability preserve are made of an organic material.

In other words, about 70% of the organic solderability preserve film is removed while the reflow process is performed after an organic solderability preserve surface treatment process, and about 90% or more is removed after the deflux process. Due to this, Cu is exposed, and the exposed Cu reacts with oxygen in the air, thereby generating CuO and $Cu_2O$ as copper oxide. In the copper oxide, when CuO is exposed to a copper pad, discoloration occurs.

For a specific example, bare Cu, in which all of the organic solderability preserve film is removed, is bound to oxygen and oxidized to cause incomplete combustion, thereby forming $Cu_2O$ exhibiting a brown color with yellow-red (see, FIG. 2). Here, the reaction equation is that $4Cu+O_2 \rightarrow 2Cu_2O$, and a surface SEM photograph thereof is shown in FIG. 3.

In addition, the bare Cu is bound to oxygen and oxidized, and thus completely combusted, thereby forming CuO exhibiting a black-red color (see, FIG. 4). Here, the reaction equation is that $2Cu+O_2 \rightarrow 2CuO$, and a surface SEM photograph thereof is shown in FIG. 5.

Here, $Cu_2O$ does not substantially incur a defect of discoloration, but CuO incurs severe discoloration as shown in FIG. 4.

Therefore, there needs a method for solving the discoloration problem due to CuO, which is formed by oxidation of copper occurring during surface treatment of the printed circuit board.

SUMMARY OF THE INVENTION

An object of the present invention is to provide to method for surface-treating a printed circuit board capable of solving a discoloration problem due to oxidation of copper during surface treatment of the printed circuit board.

Another object of the present invention is to provide a printed circuit board having a surface treatment layer in which copper is not discolored, which is manufactured by the method.

According to an exemplary embodiment of the present invention, there is provided a method for surface-treating a printed circuit board, including: plasma-treating a surface of a printed circuit board; treating the plasma-treated substrate with an organic solderability preserve; performing heat treatment on the substrate treated with the organic solderability preserve; printing a solder paste on the substrate subjected to the heat treatment; reflowing the solder paste printed substrate to fix the solder paste; and deflux washing the resulting substrate.

The heat treatment may be performed by three stages: a temperature rise stage, a temperature maintenance stage, and a temperature drop stage.

The heat treatment may include: performing the temperature rise stage from room temperature to 180° C.; performing the temperature maintenance stage at a temperature between 100 to 180° C.; and performing temperature drop stage from 180° C. to room temperature.

The temperature rise stage may be performed for 1 to 60 minutes, the temperature maintenance stage may be performed for 10 to 120 minutes, and the temperature drop stage may be performed for 10 to 120 minutes, at the time of heat treatment.

The method may further include forming a $Cu_2O$ coating before the heat treatment.

The $Cu_2O$ coating may have a thickness of 0.01 to 1 μm.

According to an exemplary embodiment of the present invention, there is also provided a printed circuit board, comprising a surface treatment layer, wherein the surface treatment layer is formed by performing heat treatment on a substrate treated with an organic solderability preserve.

The printed circuit board may have no discoloration.

DESCRIPTION OF THE PREFERRED EMBODIMENTS

Hereinafter, the present invention will be described in more detail.

Terms used in the present specification are for explaining the embodiments rather than limiting the present invention. Unless explicitly described to the contrary, a singular form may include a plural form in the present specification. The word "comprise" and/or "comprising," will be understood to imply the inclusion of stated constituents, steps, operations and/or components but not the exclusion of any other constituents, steps, operations and/or components.

The present invention is directed to a method for surface-treating a printed circuit board capable of preventing discoloration of copper and a printed circuit board including a surface treatment layer.

Figure 6:
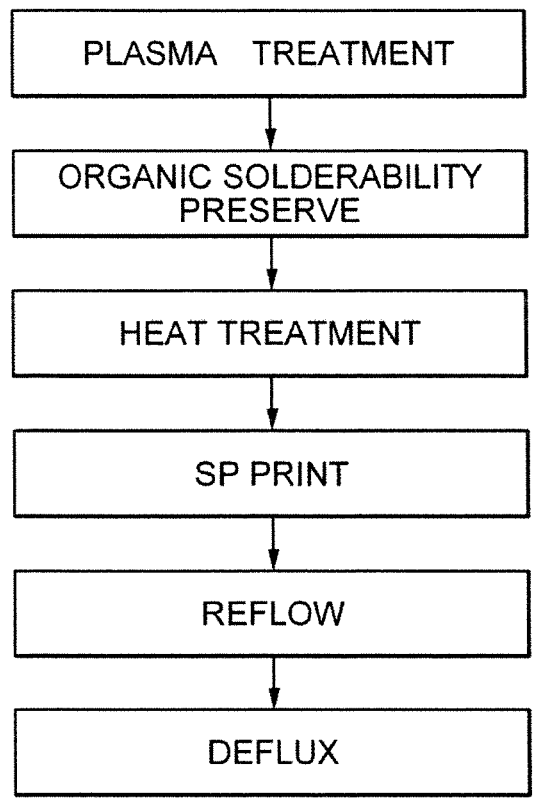
FIG. 6 is a view showing a procedure of surface-treating a printed circuit board according to the present invention.

The method for surface-treating a printed circuit board according to the present invention may be performed through a series of processes shown in FIG. 6.

First, a surface of a substrate is plasma-treated. The substrate is plasma-treated in order to form roughness on a surface of copper, which is to be exposed except for a solder resist. Copper pads for organic solderability preserve treatment may be easily prepared through the plasma treatment. Ordinary conditions for the plasma treatment, which are generally used in manufacturing a printed circuit board, may be utilized, and the conditions for the plasma treatment are particularly not limited.

Then, the plasma-treated substrate is treated with an organic solderability preserve. A specific material of the organic solderability preserve is not particularly limited, and any material that can be ordinarily used in surface-treating the printed circuit board is usable.

The present invention is particularly characterized by performing a heat treatment process after treatment with the organic solderability preserve. The heat treatment is preferably constituted of three stages: a temperature rise stage, a temperature maintenance stage, and a temperature drop stage.

Specifically, the heat treatment preferably consists of a stage of raising the temperature from room temperature to 180° C., a stage of maintaining the temperature between 100 and 180° C., and a stage of dropping the temperature from 180° C. to room temperature.

Here, it is preferable to perform the temperature rise stage such that the temperature is raised from room temperature to 180° C. for 1 to 60 minutes, and perform the temperature maintenance stage such that the temperature is maintained between about 100 and about 180° C. for 10 to 120 minutes. In addition, it is preferable to perform the temperature drop stage from 180° C. to room temperature for 10 to 120 minutes. In the above conditions, factors causing surface discoloration can be controlled by the three-stage heat treatment.

In addition, the present invention may further include forming a $Cu_2O$ coating before the heat treatment. This is for preventing discoloration of copper by coating $Cu_2O$ on a surface of Cu before CuO is formed, in order to prevent a surface of bare Cu from being oxidized and transformed after the defluxing process. Since the surface uniformly coated with $Cu_2O$ does not easily react with CuO, discoloration can be prevented. It is preferable to form the $Cu_2O$ coating to have a thickness 0.01 to 1 µm in view of preventing discoloration.

Then, a solder paste is printed. In order to form the solder paste, a solder paste composition may be printed, or solder balls may be mounted on dotted flux by using a pickup unit.

Then, a reflow process is performed for fusion-adhering and fixing the solder paste. The reflow process may be performed by applying high-temperature radiant heat or hot wind, but conditions therefore are not particularly limited.

Here, some of the flux is not volatilized, but smeared on the solder ball while it wraps the entire surface of the solder ball. Therefore, a deflux process is performed in order to remove the flux wrapping the surface of the solder ball. The deflux process is performed such that distilled water is jetted toward the solder balls to remove the flux smeared on the surface of each of the solder balls when a substrate passes through the deflux apparatus.

In addition, the present invention is characterized by including a surface treatment layer obtained by performing heat treatment on the substrate treated with the organic solderability preserve, in a printed circuit board including a surface treatment layer.

The printed circuit board according to the present invention is characterized in that discoloration of copper is previously prevented, and thus, discoloration does not occur due to the oxidation of copper. Therefore, the present invention can meet various multi-reflow processes, as compared with products of the related art.

Hereinafter, an exemplary embodiment of the present invention will be described in detail. The following examples are only for illustrating the present invention, and the scope of the present invention should not be construed as being limited by these examples. In addition, specific compounds are used in the following examples, but it is obvious to those skilled in the art that equivalents thereof can exhibit the same or similar degrees of effects.

Example

A printed circuit board was manufactured by using processes as shown in FIG. 6.

First, a substrate was plasma-treated in order to form roughness on a surface of Cu, which is to be exposed except for a solder resist (SR). An organic solderability preserve film (0.3 µm) was coated on a surface of the plasma-treated substrate, and then heat treatment was performed on the resulting substrate through a temperature rise period (room temperature to 150° C., 10 min), a temperature maintenance period (150° C., 30 min), and a temperature drop period (150° C. to room temperature, 30 min) by using a box oven.

Then, a solder paste print process was performed as a bumping process for packaging, and attached solder balls were fixed by a reflow process. In addition, a deflux washing process was performed in order to remove flux components remaining on the surfaces of the solder balls, and thus, a printed circuit board having a surface treatment layer was manufactured.

Comparative Example

Figure 1:
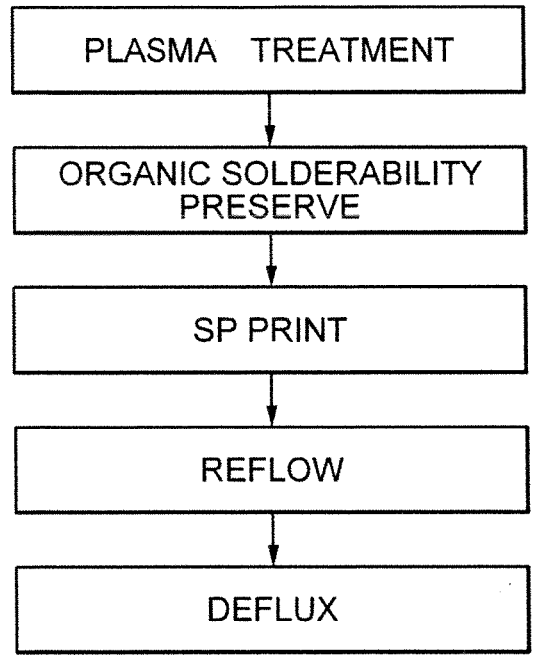
FIG. 1 is a view showing a procedure of surface-treating a printed circuit board according to the related art.
Figure 2:
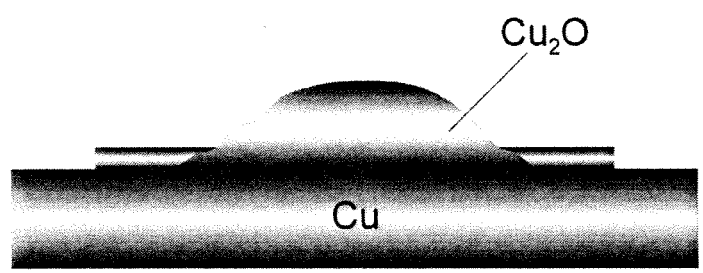
FIG. 2 is a view shown a state in which copper is transformed into $Cu_2O$ after surface treatment with an organic solderability preserve according to the related art.
Figure 3:
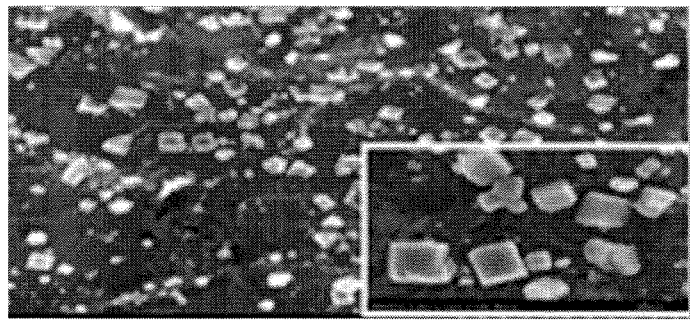
FIG. 3 is a surface scanning electron microscope (SEM) photograph of FIG. 2.
Figure 4:
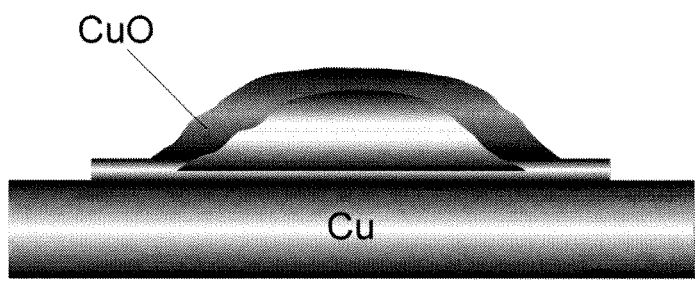
FIG. 4 is a view showing a state in which copper is transformed into CuO after surface treatment with an organic solderability preserve according to the related art.
Figure 5:
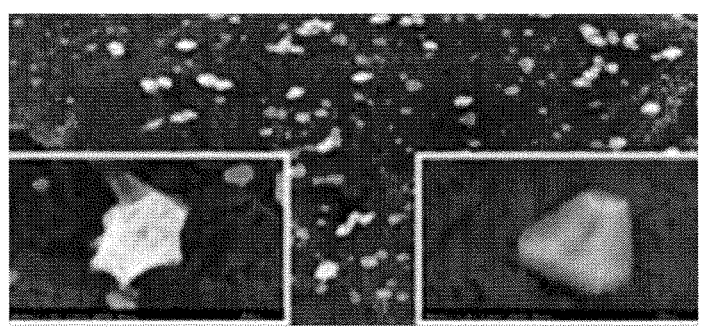
FIG. 5 is a surface SEM photograph of FIG. 4.

A printed circuit board was manufactured without a heat treatment, as shown in FIG. 1.

Experimental Example

Defective Ratio and Verification on Surface Discoloration

Figure 7:
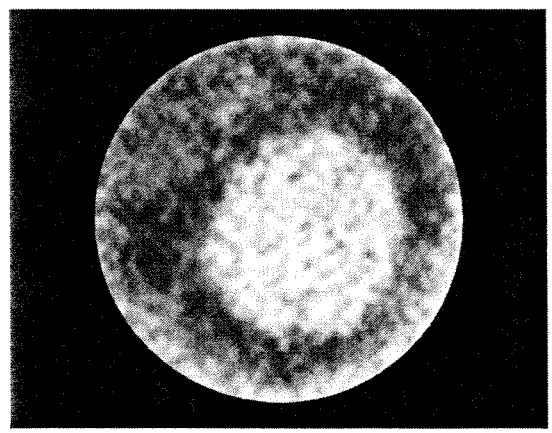
FIG. 7 is an SEM photograph of a surface treatment layer of a printed circuit board, manufactured by a method according to Comparative Example 1.
Figure 8:
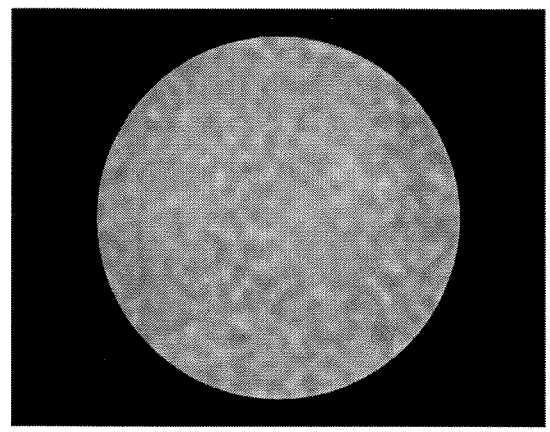
FIG. 8 is an SEM photograph of a surface treatment layer of a printed circuit board, manufactured by a method according to Example 1.

In respect to each of the printed circuit boards manufactured according to an Example and a Comparative Example, defective ratio and discoloration of a copper surface were verified by using a scanning electron microscope (SEM), and the results were shown in Table 1 and FIGS. 7 and 8.

TABLE 1

|  | Time for heat treatment | Defective ratio |
|---|---|---|
| Comparative Example | 0 min | 61/160 (38%) |
| Example | 30 min | 12/160 (7.5%) |

As shown in Table 1, it could be confirmed that, in a surface treatment layer of the printed circuit board according to the Example, which was subjected to treatment with the organic solderability preserve after heat treatment, the discoloration degree of a copper pad is significantly reduced. This can be also confirmed from FIG. 7, in which a copper surface layer is scarcely discolored and exhibits the same color as copper.

However, a surface treatment layer of the printed circuit board according to the Comparative Example, that is, which was manufactured according to the related art, has a high defective ratio due to discoloration of copper. In addition, it can be seen from FIG. 8, in which copper is oxidized and thus severely discolored.

These results show that the discoloration problem due to oxidation of copper can be solved by using a heat treatment process after treatment with an organic solderability preserve.

As set forth above, according to the present invention, the discoloration problem due to oxidation of copper can be solved by performing heat treatment under predetermined conditions after treatment with an organic solderability preserve. Therefore, the present invention can meet various multi-reflow processes, as compared with products of the related art.

While the present invention has been shown and described in connection with the embodiments, it will be apparent to those skilled in the art that modifications and variations can be made without departing from the spirit and scope of the invention as defined by the appended claims.

What is claimed is:

1. A method for surface-treating a printed circuit board, comprising:
    plasma-treating a surface of a printed circuit board;
    treating the plasma-treated printed circuit board with an organic solderability preserve;
    forming a $Cu_2O$ coating on the printed circuit board; then
    performing heat treatment on the printed circuit board treated with the organic solderability preserve;
    printing a solder paste on the printed circuit board subjected to the heat treatment;
    reflowing the solder paste printed circuit board to fix the solder paste; and
    deflux washing the resulting printed circuit board.

2. The method according to claim 1, wherein the heat treatment is performed by three stages: a temperature rise stage, a temperature maintenance stage, and a temperature drop stage.

3. The method according to claim 2, wherein the heat treatment includes:
    performing the temperature rise stage from room temperature to 180° C.;
    performing the temperature maintenance stage at a temperature between 100 to 180° C.; and
    performing temperature drop stage from 180° C. to room temperature.

4. The method according to claim 3, wherein the temperature rise stage is performed for 1 to 60 minutes, the temperature maintenance stage is performed for 10 to 120 minutes, and the temperature drop stage is performed for 10 to 120 minutes, at the time of heat treatment.

5. The method according to claim 1, wherein the $Cu_2O$ coating has a thickness of 0.01 to 1 µm.

* * * * *